United States Patent [19]

Knischka et al.

[11] Patent Number: 4,525,171

[45] Date of Patent: Jun. 25, 1985

[54] GRADIENT PROCESS OF GROWING CRYSTALS FROM LIQUID MEDIA

[75] Inventors: Paul O. Knischka, Steyr, Austria; Hans J. Grenz, Munich, Fed. Rep. of Germany

[73] Assignee: Knischka Rubine Gesellschaft m.b.H, Vienna, Austria

[21] Appl. No.: 555,874

[22] PCT Filed: Mar. 30, 1983

[86] PCT No.: PCT/AT83/00008

§ 371 Date: Nov. 8, 1983

§ 102(e) Date: Nov. 8, 1983

[87] PCT Pub. No.: WO83/03431

PCT Pub. Date: Oct. 13, 1983

[30] Foreign Application Priority Data

Mar. 30, 1982 [AT] Austria .................................. 1226/82

[51] Int. Cl.³ ............................................. B01D 9/02
[52] U.S. Cl. ........................................ 23/300; 23/301; 23/305 A; 156/619
[58] Field of Search ............................. 156/619–621, 156/623 R, 623 Q, DIG. 61; 23/300, 301, 305 R, 305 A

[56] References Cited

U.S. PATENT DOCUMENTS

| | | | |
|---|---|---|---|
| 2,875,108 | 2/1959 | Pfann | 148/1 |
| 3,148,023 | 9/1964 | Ploss | 23/300 |
| 3,714,329 | 1/1973 | Arnaud | 23/300 |
| 3,758,705 | 9/1973 | Schmid | 23/300 |
| 3,788,818 | 1/1974 | Madjid et al. | 23/300 |
| 3,819,335 | 6/1974 | Daniels et al. | 23/300 |

FOREIGN PATENT DOCUMENTS

| | | | |
|---|---|---|---|
| 2300989 | 7/1974 | Fed. Rep. of Germany | |
| 1293744 | 5/1962 | France | |
| 680232 | 10/1952 | United Kingdom | 23/301 R |

*Primary Examiner*—David L. Lacey
*Attorney, Agent, or Firm*—Kurt Kelman

[57] ABSTRACT

In a gradient process of growing crystals from liquid media, the need for mechanical seed holders is eliminated in that a solvent is used which at the instantaneous temperature and under the instantaneous pressure employed in the growing process has a density which is equal or approximately equal to the density of the crystal or crystals which is or are being grown.

2 Claims, No Drawings

GRADIENT PROCESS OF GROWING CRYSTALS FROM LIQUID MEDIA

Crystals are grown from various inorganic or organic liquids. For industrial use it is mainly desired to achieve a high purity for the utilization of physical effects. For the production of doubles in the precious stone trade it is desired to obtain grown products which have a proper form, which is as similar as possible to natural products and has undamaged, naturally grown crystal surfaces.

All known growing processes require seed crystal holders of mechanical type unless microseeds are used or macroseeds are used in conjunction with rotating magnetic fields or the processes are carried out in an extraterrestrial environment.

It may be possible to grow crystals from gel or vapor phases and the like without a need for a crystal holder but in that case the resulting crystals grow on and adhere to solid surfaces and will certainly be damaged when they have been detached. This applies also to crystals which form spontaneously as a result of supersaturation; this is due to the fact that with a critical radius $r_k$ or a smaller radius of the nucleus the surface tensions of the solutions of molten materials predominate over the weight of the nucleus so that said micronuclei will always float on the surface of the solvent regardless of the density ratio of the nucleus to the solvent.

Owing to the light weight of such nuclei, they will spontaneously form at the locations at which a supersaturation exists rather then at the "top" or "bottom".

For all nuclei which are larger than $r_k$ it has previously been necessary to precisely locate them so that they (a) will not fall down or (b) will not float on the meniscus of the solvent, depending on whether their density ($d_k$) is higher or lower than the density ($d_s$) of the solvent or molten material Su represent the lower portion of the growing region, Sm represents the middle portion of the growing region and So represent the upper portion of the growing region For this reason it is an object of the invention to provide a process which enables a growing operation in which one or more seeds can be used without seed holders. This object is accomplished in that the growing is effected in a solvent having a density which is equal or approximately equal to the density of the grown crystal at the instantaneous temperature and under the instantaneous pressure employed in the growing process ($d_k \approx d_s = d_L$) so that the seeds float in the mass, in the feed solution or the like, $d_L$ being the density of the solution.

A gradient process can be performed by which crystals having the quality of precious stones can be grown in a terrestrial environment whereas gravitation is entirely or almost entirely inhibited. Because the density of liquid solvents will always exhibit a much higher dependence on temperature than the density of solids (nuclei), it can be assumed that in a gradient process the lower portion of the growing region will be somewhat warmer than the middle portion and the upper portion will be somewhat cooler than the middle portion ($t_{su} > t_{so}$).

When the feed substance is established in the lower, warmer portion then $t_n = t_{sm} + \Delta t$, wherein $t_n$ is the temperature of the solution (molten material) in the feeding region in °C., $\Delta t$ is the temperature gradient in the solution (molten material) in °C., $t_{sm}$ is the temperature of the solution (molten material) in the middle growing region in °C., $t_{su}$ is the temperature of the solution (molten material) in the lower growing region in °C. and $t_{so}$ is the temperature of the solution (molten material) in the upper growing region in °C.

Because the temperatures are held most precisely constant in all gradient processes, the fact that $t_{su} > t_{sm} > t_{so}$ permits for the densities of the liquid solvent in the growing region (if liquid salt mixtures having positive coefficients of expansion are used) the conclusion that $d_{su} < d_{sm} > d_{so}$, i.e., the densities ($d_s$) of the liquid salt mixtures are lower in the lower region ($d_{su}$) and increase in an upward direction from the middle growing region ($d_{sm}$) to the upper growing region ($d_{so}$). As a result, a nucleus having the density $d_k = d_{sm}$ must float in the middle of the growing region. But convection currents may cause the nucleus, to move somewhat, e.g., in a downward direction, to a location in which it would remain for the time being, because now $d_k > d_{su}$, until the nucleus will spontaneously rise by further convection and owing to the gradual rise of the nucleus and the upper location will now be apparently allocated because now $d_k < d_{so}$. But the nucleus will depart also from that location and will move, inter alia, in a downward direction. This can easily take place in case of a slight cooling of the nucleus as an additional effect. This explains an additional stirring action. The feedback control system of that stirring mechanism will operate inversely if the corresponding gradient process uses inverse solution and seed arrangements.

For this reason the seed or seeds can be positioned at the center of the solvent without a need for seed holders of any kind. The stirring action is most favorable for the homogeneity and the speed of the growth.

As in all gradient processes, the growing region is separated from the feeding region by a sieve.

The technical progress afforded by this invention is seen only in that it shows that even for relatively heavy crystals (crystals having a high density) it is possible to prepare feed solutions which have the same density as the growing crystal at the temperature and the pressure ($t_{sm}$, $P_{sm}$) which are desired for the growing process.

But even crystals having a relatively low density may be surrounded by feed solutions having the same density and in that case will float in the corresponding solution in accordance with the statement $d_k = d_L$ made in accordance with the invention and will be stirred by convection currents.

The following example will be described:

Corundum, i.e., also ruby, has at room temperature a density $d_k = 3.99$ or 4.0. It has been known for decades that $PbO(d_{s1} = 9.36)$ as well as $B_2O_3(d_{s2} = 1.844)$ exhibit the same melting behavior in conjunction with ruby ($Al_2O_3$, $Cr_2O_3$). It will easily be understood that the two compounds PbO and $B_2O_3$ can be mixed in such molar percentages or percentages by weight that a density of 3.99 will be obtained at a given temperature $t_{sm}$ and a given pressure $p_{sm}$. In that case it is sufficient to ensure that an azeotropic salt mixture is provided if the growth is effected in growing regions which are not sealed.

If a salt mixture exhibits a non-azeotropic behavior, in a open system, the individual components of the mixture would change their proportions, i.e., also the overall density of the salt mixture, so that $d_k \neq d_L$. Innumerable compositions can be used in carrying out the process according to the invention and it is not necessary to mix only two salts but any desired number of salt mixtures may be used, provided that their sum density $d_L$ again equals $d_k$. Some salts may decisively influence the density and others (which have approximately the same density as the seed) may be more responsible for the formation of certain surfaces, i.e., for the isometry. In a solvent medium in which the floating seeds are no longer subject to gravitational forces the intermolecular forces, which are otherwise ineffective, are effective and will cause, e.g., two floating seeds to attach to each other and so that they will then merge to form, e.g., a twin, whereas triplets could form from three seeds which are present etc. But because equally oriented faces of floating seeds will face each other only in dependence on the instantaneous relative position, the stirring speed, the dipole etc., an oriented merging cannot be expected unless floating seeds are present in an adequate number.

We claim:

1. A gradient process of growing crystals from liquid media, comprising growing the crystals in a solvent which at the instantaneous temperature and under the instantaneous pressure employed in the growing process has a density which is equal or approximately equal to the density of the crystals which are being grown.

2. The process of claim 1, wherein the solvent is azeotropic at the temperature and pressure employed in the growing process.

* * * * *